United States Patent
Ho et al.

(10) Patent No.: US 11,784,654 B2
(45) Date of Patent: Oct. 10, 2023

(54) DIGITAL-TO-ANALOG CONVERSION APPARATUS AND METHOD HAVING SIGNAL CALIBRATION MECHANISM

(71) Applicant: REALTEK SEMICONDUCTOR CORPORATION, Hsinchu (TW)

(72) Inventors: Hsuan-Ting Ho, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 36 days.

(21) Appl. No.: 17/691,502

(22) Filed: Mar. 10, 2022

(65) Prior Publication Data
US 2022/0407531 A1    Dec. 22, 2022

(30) Foreign Application Priority Data
Jun. 17, 2021    (TW) ................. 110122152

(51) Int. Cl.
H03M 1/10    (2006.01)
H03M 7/00    (2006.01)
H03M 1/66    (2006.01)

(52) U.S. Cl.
CPC ....... H03M 1/1009 (2013.01); H03M 1/1071 (2013.01); *H03M 1/10* (2013.01); *H03M 1/66* (2013.01); *H03M 7/00* (2013.01)

(58) Field of Classification Search
CPC .... H03M 1/1009; H03M 1/1071; H03M 7/00; H03M 1/10; H03M 1/66
See application file for complete search history.

(56) References Cited

U.S. PATENT DOCUMENTS

2009/0040079 A1*    2/2009 Sutardja .............. H03M 1/1019
341/120

OTHER PUBLICATIONS

U.S. Appl. No. 17/683,397, "Digital-to-analog conversion apparatus and method having signal calibration mechanism" Filing date: Mar. 1, 2022 (YYYY-MM-DD), USA.
Taiwan patent application No. TW110115065, "Digital-to-analog conversion apparatus and method having signal calibration mechanism" Filing date: Apr. 27, 2021 (YYYY-MM-DD), Taiwan.

* cited by examiner

*Primary Examiner* — Joseph J Lauture
(74) *Attorney, Agent, or Firm* — WPAT, P.C

(57) ABSTRACT

The present invention discloses a DAC method having signal calibration mechanism. A first conversion circuit generates a first analog signal according to an input digital signal. A second conversion circuit generates a second analog signal according to the input digital signal and a pseudo-noise digital signal. An echo transmission circuit processes a signal on an echo path to generate an echo signal. A first and a second calibration circuits generate a first and a second calibration signals. A calibration parameter calculation circuit performs calculation according to a difference between the echo signal and a sum of the first and the second calibration signals and related path information to generate a first and a second offsets. The first and the second calibration circuits converge first and second response coefficients and update a first and a second codeword offset tables according to the first and the second offsets.

10 Claims, 5 Drawing Sheets

DIGITAL-TO-ANALOG CONVERSION APPARATUS AND METHOD HAVING SIGNAL CALIBRATION MECHANISM

BACKGROUND OF THE INVENTION

1. Field of the Invention

The present invention relates to a digital-to-analog conversion apparatus and a digital-to-analog conversion method having signal calibration mechanism.

2. Description of Related Art

A DAC circuit is an important circuit component that converts a signal from a digital form to an analog form. Based on different digital codes, the DAC circuit can multiply the digital codes by a corresponding conversion gain value to generate analog signals with different intensities.

However, when the DAC circuit includes a plurality of circuits for performing calibration and echo-canceling that is needed to be trained, the interaction among these circuits causes difficulty in training.

SUMMARY OF THE INVENTION

In consideration of the problem of the prior art, an object of the present invention is to supply a digital-to-analog conversion apparatus and a digital-to-analog conversion method having signal calibration mechanism.

The present invention discloses a digital-to-analog conversion (DAC) apparatus having signal calibration mechanism that includes a first conversion circuit, a second conversion circuit, an echo transmission circuit, a first calibration circuit, a second calibration circuit and a calibration parameter calculating circuit. The first conversion circuit receives an input digital signal having a codeword from a signal source when being enabled to perform digital-to-analog conversion to generate a first analog signal to an echo path. The second conversion circuit receives the input digital signal from the input digital signal and receives a pseudo-noise digital signal from a pseudo-noise source when being enabled to perform digital-to-analog conversion to generate a second analog signal to the echo path. The echo transmission circuit performs signal processing on the echo path to generate an echo signal. The first calibration circuit performs mapping according to a first codeword offset mapping table and perform processing according to a group of first response coefficients based on a feeding of the input digital signal, to generate a first calibration signal corresponding to a first conversion circuit. The second calibration circuit performs mapping according to a second codeword offset mapping table and performs processing according to a group of second response coefficients based on a feeding of the input digital signal and the pseudo-noise digital signal, to generate a second calibration signal corresponding to a second conversion circuit. The calibration parameter calculating circuit generates a first offset and a second offset according to a difference between the echo signal and a combination of the first calibration signal and the second calibration signal and path information related to the first calibration circuit and the second calibration circuit. The first calibration circuit and the second calibration circuit respectively make the group of first response coefficients and the group of the second response coefficients converge according to the echo signal and respectively update the first codeword offset mapping table and the second codeword offset mapping table according to the first offset and the second offset.

The present invention also discloses a digital-to-analog conversion method having signal calibration mechanism that includes the steps outlined below. An input digital signal having a codeword is received from a signal source by a first conversion circuit when being enabled to perform digital-to-analog conversion to generate a first analog signal to an echo path. The input digital signal is received from the signal source and a pseudo-noise digital signal is received from a pseudo-noise source by a second conversion circuit when being enabled to perform digital-to-analog conversion to generate a second analog signal to the echo path. Signal processing is performed on the echo path by an echo transmission circuit to generate an echo signal. Mapping is performed according to a first codeword offset mapping table and processing is performed according to a group of first response coefficients by a first calibration circuit based on a feeding of the input digital signal, to generate a first calibration signal corresponding to a first conversion circuit. Mapping is performed according to a second codeword offset mapping table and processing is performed according to a group of second response coefficients by a second calibration circuit based on a feeding of the input digital signal and the pseudo-noise digital signal, to generate a second calibration signal corresponding to a second conversion circuit. A first offset and a second offset are generated by a calibration parameter calculating circuit according to a difference between the echo signal and a combination of the first calibration signal and the second calibration signal and path information related to the first calibration circuit and the second calibration circuit. The group of first response coefficients and the group of the second response coefficients are respectively converged according to the echo signal and the first codeword offset mapping table and the second codeword offset mapping table are respectively updated according to the first offset and the second offset by the first calibration circuit and the second calibration circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a digital-to-analog conversion apparatus and a digital-to-analog conversion method having signal calibration mechanism to perform training on the calibration circuits with different training stages according to the feeding of different signals to avoid the effect on the training due to the interaction among different calibration circuits.

Figure 1:
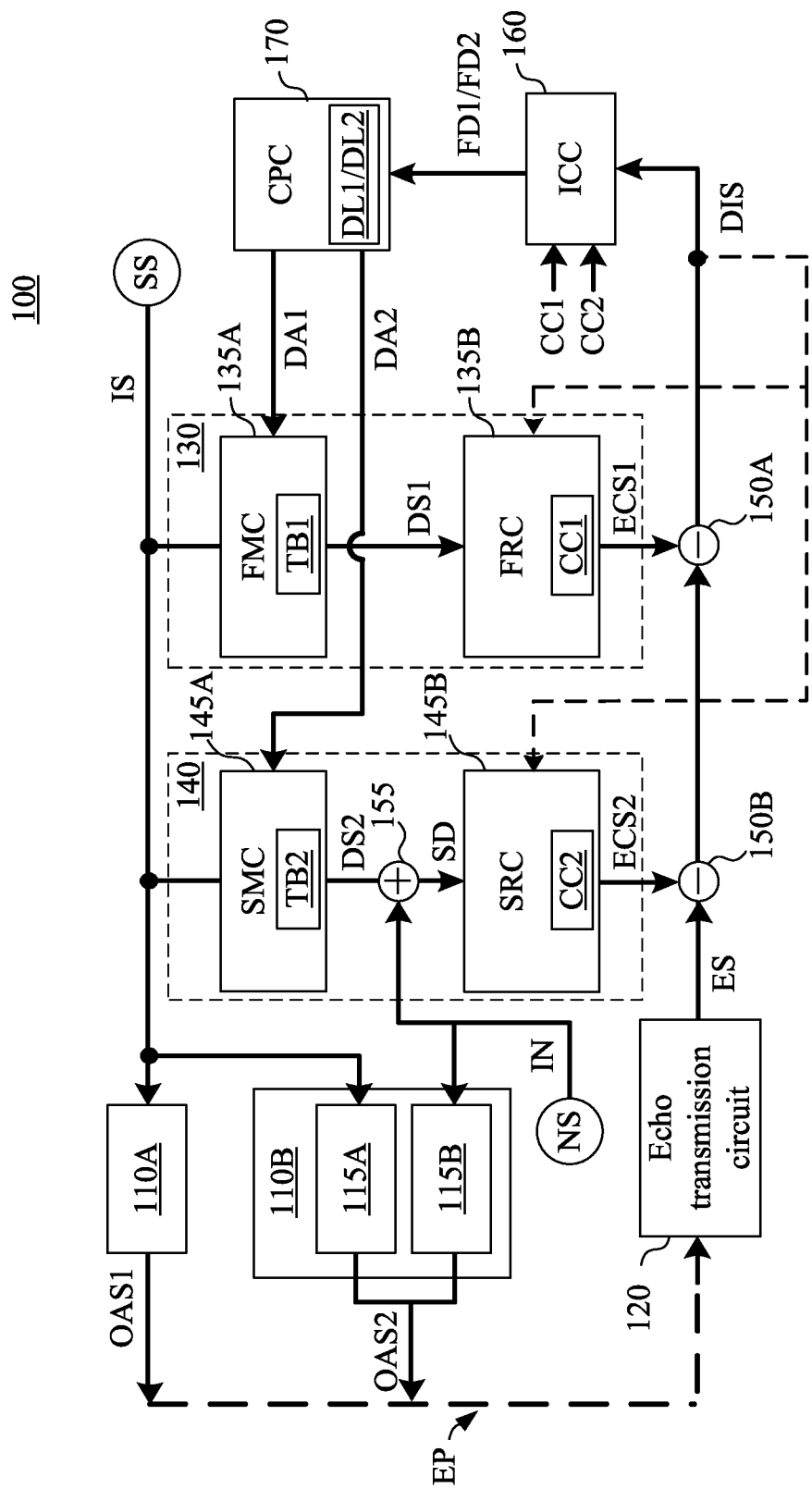
FIG. 1 illustrates a block diagram of a digital-to-analog conversion apparatus having signal calibration mechanism according to an embodiment of the present invention.

Reference is now made to FIG. 1. FIG. 1 illustrates a block diagram of a digital-to-analog conversion (DAC) apparatus 100 having signal calibration mechanism according to an embodiment of the present invention. The DAC apparatus 100 includes a first conversion circuit 110A, a second conversion circuit 110B, an echo transmission circuit 120, a first calibration circuit 130, a second calibration circuit 140, a first error calculating circuit 150A, a second error calculating circuit 150B, an inverted error calculating circuit 160 (abbreviated as ICC in FIG. 1) and a calibration parameter calculating circuit 170 (abbreviated as CPC in FIG. 1).

The first conversion circuit 110A, when being enabled, receives an input digital signal IS including a codeword from a signal source SS, e.g. a transmission circuit (TX) of a communication system, to perform digital-to-analog conversion thereon to generate a first analog signal OAS1. In an embodiment, the first conversion circuit 110A is an output digital-to-analog conversion circuit, and the first analog signal OAS1 generated therefrom is an output analog signal that is outputted to an external circuit and also to an echo path EP.

The second conversion circuit 110B, when being enabled, receives the input digital signal IS from the signal source SS and receives a pseudo-noise source NS from the pseudo-noise source NS to perform digital-to-analog conversion thereon to generate a second analog signal OAS2 that is outputted to the echo path EP.

In an embodiment, the pseudo-noise digital signal IN generated by the pseudo-noise source NS is a random signal of 0 and 1 used to simulate a noise. In an embodiment, the second conversion circuit 110B is an echo-canceling digital-to-analog conversion circuit, and the second analog signal OAS2 generated therefrom is an echo-canceling analog signal to perform echo-canceling on the first analog signal OAS1 on the echo path EP.

In an embodiment, the second conversion circuit 110B includes a non-noise conversion circuit 115A and a noise conversion circuit 115B. The non-noise conversion circuit 115A receives the input digital signal IS IN to perform digital-to-analog conversion thereon and the noise conversion circuit 115B receives the pseudo-noise digital signal IN to perform digital-to-analog conversion thereon. The non-noise conversion circuit 115A and the noise conversion circuit 115B together generate the second analog signal OAS2.

In an embodiment, the first conversion circuit 110A, the non-noise conversion circuit 115A in the second conversion circuit 110B and the noise conversion circuit 115B in the second conversion circuit 110B may respectively include a plurality of current sources (not illustrated in the figure). The codeword of the input digital signal IS and the pseudo-noise digital signal IN can control the operation of the corresponding current sources to generate the first analog signal OAS1 and the second analog signal OAS2.

The echo transmission circuit 120 performs signal processing, such as echo response processing and analog-to-digital conversion on the echo path EP to generate an echo signal ES, in which the low-pass filtering and other digital signal processing can be selectively performed.

In an embodiment, the first calibration circuit 130 includes a first mapping circuit 135A and a first response circuit 135B.

The first mapping circuit 135A performs mapping according to a first codeword offset mapping table TB1 based on the codeword of the input digital signal IS to generate a first mapping signal DS1. The first codeword offset mapping table TB1 includes a plurality of correspondence relations each corresponds to a codeword and a codeword offset. In an embodiment, the default values of all the codeword offsets that the codeword correspond to are set to be 0 in an initial state.

The first response circuit 135B performs processing according to a group of first response coefficients CC1 on the first mapping signal DS1 to generate a first calibration signal ECS1.

In an embodiment, the second calibration circuit 140 includes a second mapping circuit 145A and a second response circuit 145B.

The second mapping circuit 145A performs mapping according to a second codeword offset mapping table TB2 based on the codeword of the input digital signal IS to generate a second mapping signal DS2. The second codeword offset mapping table TB2 includes a plurality of correspondence relations each corresponds to a codeword and a codeword offset. In an embodiment, the default values of all the codeword offsets that the codeword correspond to are set to be 0 in an initial state.

In an embodiment, the DAC apparatus 100 further includes a pseudo-noise feeding circuit 155 that receives the second mapping signal DS2 and the pseudo-noise digital signal IN to generate an added digital signal SD. The second response circuit 145B performs processing on the added digital signal SD according to a group of second response coefficients CC2 to generate a second calibration signal ECS2.

The calibration parameter calculating circuit 170 generates a first offset DA1 and a second offset DA2 according to a difference between the echo signal ES and a combination of the first calibration signal ECS1 and the second calibration signal ECS2 and path information related to the first calibration circuit 130 and the second calibration circuit 140.

In an embodiment, the first error calculating circuit 150A and the second error calculating circuit 150B perform error calculation on the echo signal ES respectively based on the first calibration signal ECS1 and the second calibration signal ECS2. The error signal DIS is eventually generated by the first error calculating circuit 150A. More specifically, the second error calculating circuit 150B calculates a first error between the echo signal ES and the second calibration signal ECS2, and the first error calculating circuit 150A subsequently calculates a second error between the first error and the first calibration signal CS1 to generate the error signal DIS.

In an embodiment, the DAC apparatus 100 further includes the inverted error calculating circuit 160. The inverted error calculating circuit 160 performs one-dimensional inversion on the first response coefficients CC1 to multiply the inverted coefficients and the corresponding values of the error signal DIS and accumulate the multiplication results to generate a first inverted error value FD1. Further, the inverted error calculating circuit 160 performs one-dimensional inversion on the second response coefficients CC2 to multiply the inverted coefficients and the corresponding values of the error signal DIS and accumulate the multiplication results to generate a second inverted error value FD2.

The calibration parameter calculating circuit 170 sets the first inverted error value FD1 as the first offset DA1 that the codeword corresponds to according to a path delay DL1 of the first response circuit 135A and the inverted error calculating circuit 160. Further, the calibration parameter calculating circuit 170 sets the second inverted error value FD2 as the second offset DA2 that the codeword corresponds to according to a path delay DL2 of the second response circuit 135B and the inverted error calculating circuit 160.

It is appreciated that the generation of the offsets described above is merely an example. In other embodiments, the calibration parameter calculating circuit 170 may generate the first offset DA1 and the second offset DA2 based on other methods.

The DAC apparatus 100 needs to perform training on the first codeword offset mapping table TB1 and the first response coefficients CC1 in the first calibration circuit 130 and the second codeword offset mapping table TB2 and the second response coefficients CC2 in the second calibration circuit 140, such that the calibration and echo-canceling of the DAC circuit can be performed based on the trained result. More specifically, the first calibration circuit 130 and second calibration circuit 140 make the first response coefficients CC1 and the second response coefficients CC2 respectively converge according to the error signal DIS calculated from the echo signal ES first, and update the first codeword offset mapping table TB1 and the second codeword offset mapping table TB2 respectively according to the first offset DA1 and the second offset DA2 subsequently.

In order to avoid the interaction among the objects to be trained, different training stages are performed by the DAC apparatus 100.

In a first training stage, the first conversion circuit 110A is disabled and the second conversion circuit 110B is enabled. Under such a condition, the echo transmission circuit 120 only receives the second analog signal OAS2 from the echo path EP and generates the echo signal ES accordingly.

The second mapping circuit 145A performs mapping according to a default version (having all the codeword offsets to be 0) of the second codeword offset mapping table TB2 on the input digital signal IS to generate the second mapping signal DS2. The second response circuit 145B performs processing according to the second response coefficients CC2 on the added digital signal SD that adds the second mapping signal DS2 and the pseudo-noise digital signal IN to generate the second calibration signal ECS2.

In a second training stage, the first conversion circuit 110A is kept to be disabled and the second conversion circuit 110B is kept to be enabled. The second mapping circuit 145A updates the second codeword offset mapping table TB2 according to the second offset DA2.

In an embodiment, the current sources included in the second conversion circuit 110B are thermometer controlled current sources. Different combinations of the current offsets of the current sources corresponding to different codeword are generated under the control of the input digital signal IS. As a result, a mapping relation between the current offsets of the current sources and the offsets of the codeword is presented.

The calibration parameter calculating circuit 170 categorizes the second offset DA2 corresponding to the different codeword into a plurality of groups according to the operation state of each of the current sources to perform statistic operation and generates an average value of the offset of each of the groups. The groups are arranged in an order such that for each two of the neighboring groups, the operation state of one of the thermometer-control current sources is at a first current output state and a second current output state respectively. By calculating the difference between the offsets of two of the neighboring group, the current offset of each of the current sources can be obtained by the calibration parameter calculating circuit 170. The offsets of the codeword can thus be mapped from the current offsets of the current source to update the second codeword offset mapping table TB2.

In an embodiment, no anchor point is set when the calibration parameter calculating circuit 170 performs the statistic operation based on grouping.

In a third training stage, the first conversion circuit 110A and the second conversion circuit 110B are enabled. Under such a condition, the echo transmission circuit 120 receives the signal after the second analog signal OAS2 performs echo-canceling on the first analog signal OAS1 on the echo path EP to generate the echo signal ES.

The first mapping circuit 135A performs mapping according to a default version (having all the codeword offsets to be 0) of the first codeword offset mapping table TB1 on the input digital signal IS to generate a first mapping signal DS1. The first response circuit 135B performs processing according to the group of first response coefficients CC1 on the first mapping signal DS1 to generate the first calibration signal ECS1.

Further, the first response circuit 135B makes the first response coefficients CC1 converge according to the difference between the echo signal ES and the combination of the first calibration signal ECS1 and the second calibration signal ECS2, i.e., the error signal DIS.

In a fourth training stage, the first conversion circuit 110A and the second conversion circuit 110B are kept to be enabled. The first mapping circuit 135A updates the first codeword offset mapping table TB1 according to the first offset DA1.

The method that the first mapping circuit 135A uses to update the first codeword offset mapping table TB1 is similar to the method that the second mapping circuit 145A uses to update the second codeword offset mapping table TB2. The detail is not described herein. The difference is only that when the calibration parameter calculating circuit 170 performs the statistic operation based on grouping of the first offset DA1, the average values of two of the groups can be set to be 0 as anchor points to avoid the interaction in the system.

By using the method described above, the DAC apparatus 100 can finish the training of the first calibration circuit 130 and the second calibration circuit 140 without the interaction among the circuits.

Figure 2:
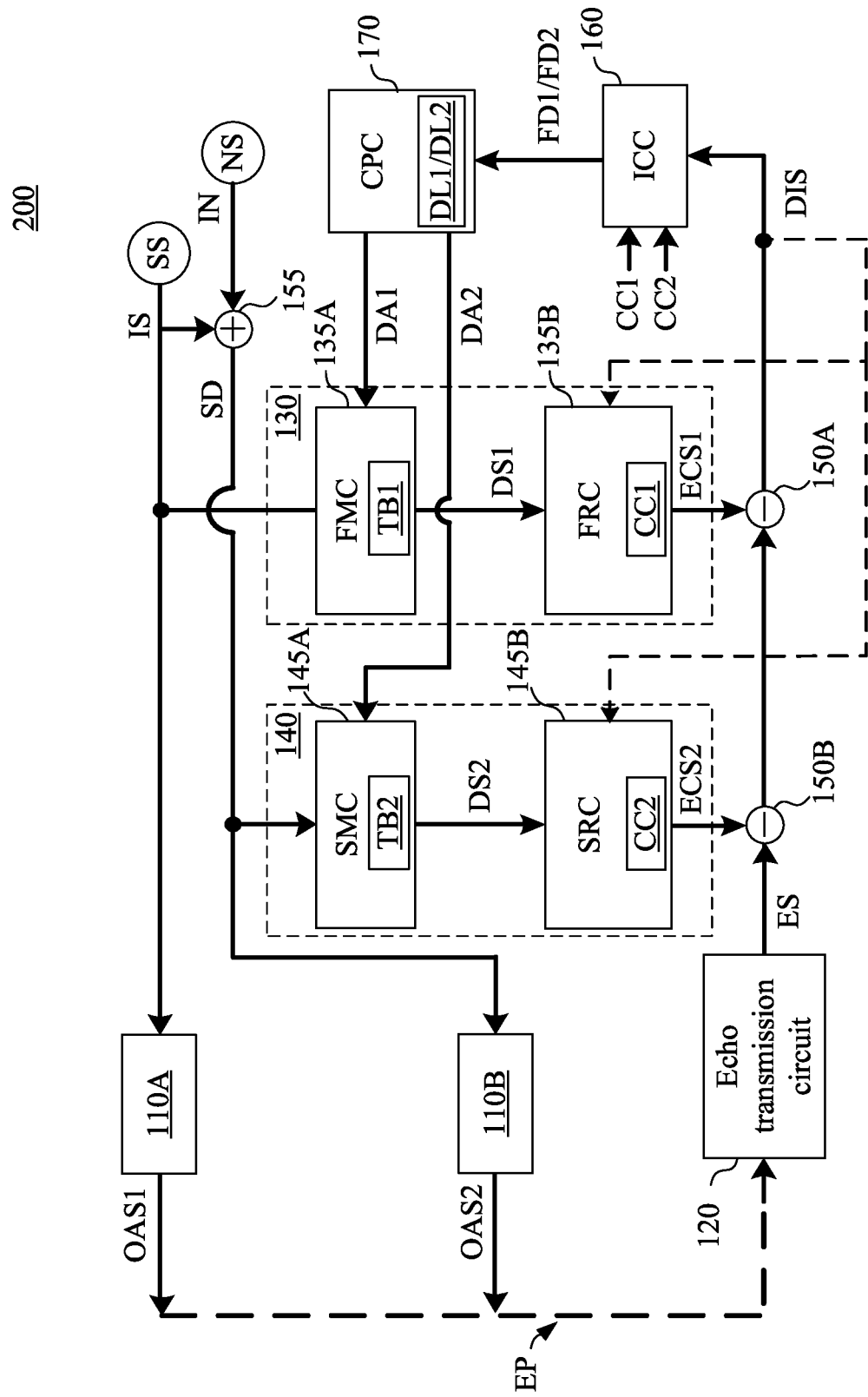
FIG. 2 illustrates a block diagram of a DAC apparatus having signal calibration mechanism according to another embodiment of the present invention.

Reference is now made to FIG. 2. FIG. 2 illustrates a block diagram of a DAC apparatus 200 having signal calibration mechanism according to another embodiment of the present invention.

The DAC apparatus 200 includes components similar to those included in the DAC apparatus 100 in FIG. 1. The identical components are not described herein.

In the present embodiment, the DAC apparatus 200 also includes the pseudo-noise feeding circuit 155. However, the pseudo-noise feeding circuit 155 in the present embodiment receives the second mapping signal DS2 from the second mapping circuit 145A and receives the pseudo-noise digital signal IN from the pseudo-noise source NS to generate the added digital signal SD. The added digital signal SD is directly fed to the second conversion circuit 110B and the second mapping circuit 145A of the second calibration circuit 140.

As a result, the second conversion circuit 110B only includes the non-noise conversion circuit 115A illustrated in FIG. 1 (not illustrated in FIG. 2) to directly receive the added digital signal SD and generate the second analog signal OAS2 accordingly. The noise conversion circuit 115B is not required to be included therein.

Further, the second mapping circuit 145A performs mapping according to the second codeword offset mapping table TB2 based on the added digital signal SD to generate the second mapping signal DS2. The second response circuit 145B performs processing according to the group of second response coefficients CC2 on the second mapping signal DS2 to generate the second calibration signal ECS2.

Under such a configuration, only two stages are required for the DAC apparatus 200 to perform training.

In a first training stage, the first conversion circuit 110A and the second conversion circuit 110B are enabled. Under such a condition, the echo transmission circuit 120 receives the signal after the second analog signal OAS2 performs echo-canceling on the first analog signal OAS1 on the echo path EP to generate the echo signal ES.

The second mapping circuit 145A performs mapping on the added digital signal SD according to a default version of the second codeword offset mapping table TB2 to generate the second mapping signal DS2. The second response circuit 145B performs processing on the second mapping signal DS2 according to the group of second response coefficients CC2 to generate the second calibration signal ECS2. The second response circuit 145B makes the second response coefficients CC2 converge according to the error signal DIS.

At the same time, the first mapping circuit 135A performs mapping on the input digital signal IS according to a default version of the first codeword offset mapping table TB1 to generate the first mapping signal DS1. The first response circuit 135B performs processing on the first mapping signal DS1 according to the group of first response coefficients CC1 to generate the first calibration signal ECS1. The first response circuit 135B makes the first response coefficients CC1 converge according to the error signal DIS.

In the second training stage, the first conversion circuit 110A and the second conversion circuit 110B are kept to be enabled. Under such a condition, the echo transmission circuit 120 receives the signal after the second analog signal OAS2 performs echo-canceling on the first analog signal OAS1 on the echo path EP to generate the echo signal ES.

The second mapping circuit 145A updates the second codeword offset mapping table TB2 according to the second offset DA2. The first mapping circuit 135A updates the first codeword offset mapping table TB1 according to the first offset DA1.

In the present embodiment, when the calibration parameter calculating circuit 170 respectively performs the statistic operation on the second offset DA2 and the first offset DA1 based on grouping, the average values of two of the groups can be set to be 0 as anchor points to avoid the interaction in the system.

By using the method described above, the DAC apparatus 200 can finish the training of the first calibration circuit 130 and the second calibration circuit 140 without the interaction among the circuits.

It is appreciated that the training of the first calibration circuit 130 and the second calibration circuit 140 of the DAC apparatus 100 and the DAC apparatus 200 can be performed in real time.

In an embodiment, each the DAC apparatus 100 and the DAC apparatus 200 may further include a first auxiliary conversion circuit (not illustrated in the figure) configured to generate a corresponding calibration signal according to the first codeword offset mapping table TB1 under the condition that the training shows that the system is stable. Such a calibration signal performs calibration on the first analog signal OAS1 generated by the first conversion circuit 110A to cancel the offset of the current sources therein such that the calibrated result serves as the signal actually outputted to the external circuit.

Further, each the DAC apparatus 100 and the DAC apparatus 200 may further include a second auxiliary conversion circuit (not illustrated in the figure) configured to generate a corresponding calibration signal according to the second codeword offset mapping table TB2 under the condition that the training shows that the system is stable. Such a calibration signal performs calibration on the second conversion circuit 110B generated by the second analog signal OAS2 to cancel the offset of the current sources therein such that the calibrated result serves as the signal actually performs echo-canceling.

As a result, the DAC apparatus 100 can perform training on the first calibration circuit 130 and the second calibration circuit 140 with different stages by feeding the input digital signal IS to the first conversion circuit 110A and the first calibration circuit 130 and feeding the input digital signal IS and the pseudo-noise digital signal IN to the second conversion circuit 110B and the second calibration circuit 140, such that the interaction among the calibration circuits can be avoided.

Figure 3:
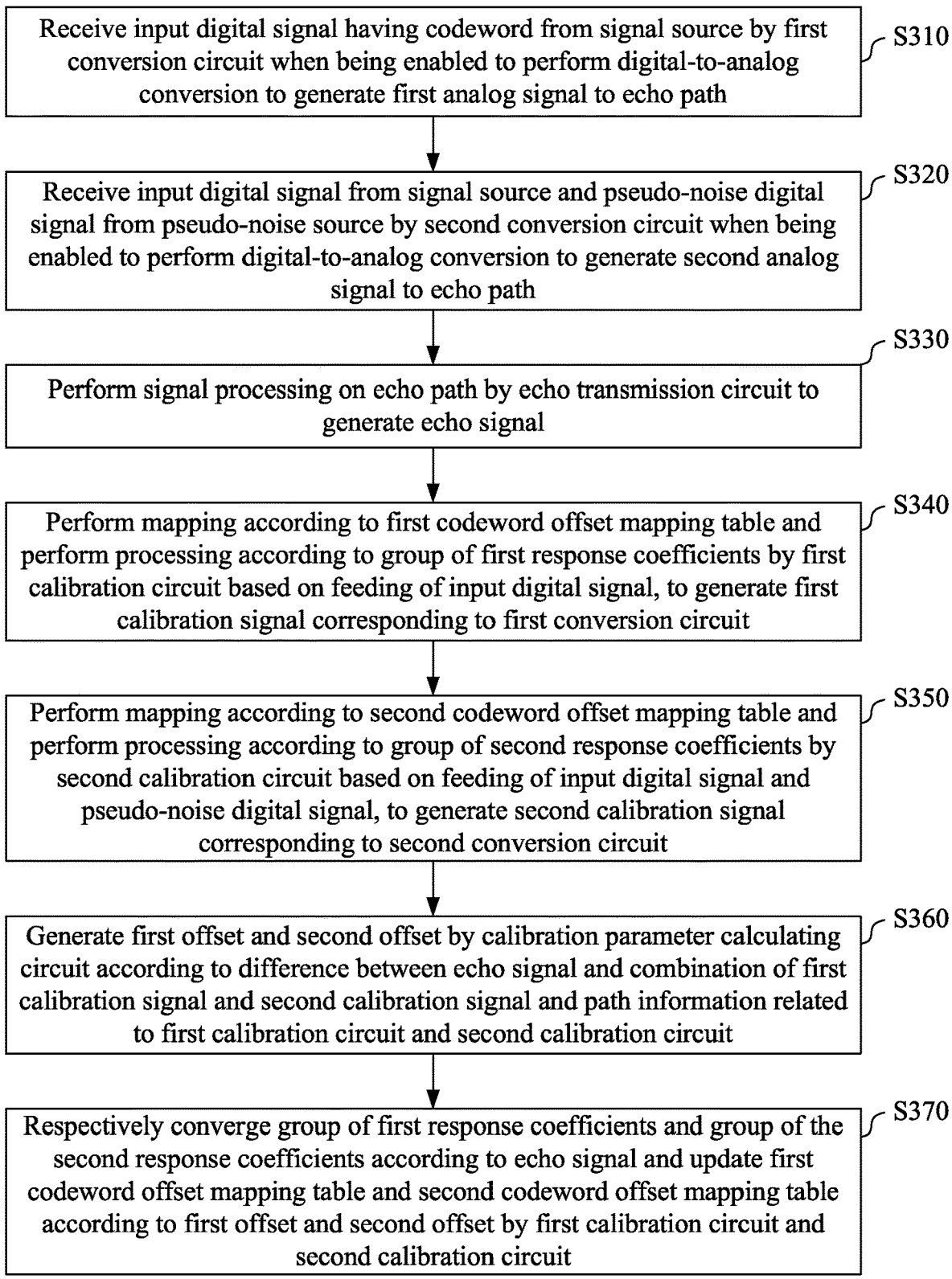
FIG. 3 illustrates a flow chart of a digital-to-analog conversion method having signal calibration mechanism according to an embodiment of the present invention.

Reference is now made to FIG. 3. FIG. 3 illustrates a flow chart of a digital-to-analog conversion method 300 having signal calibration mechanism according to an embodiment of the present invention.

In addition to the apparatus described above, the present disclosure further provides the digital-to-analog conversion method 300 that can be used in such as, but not limited to, the digital-to-analog conversion apparatus 100 in FIG. 1 or the digital-to-analog conversion apparatus 200 in FIG. 2. As illustrated in FIG. 3, an embodiment of the digital-to-analog conversion method 300 includes the following steps.

In step S310, the input digital signal IS having the codeword is received from the signal source SS by the first conversion circuit 110A when being enabled to perform digital-to-analog conversion to generate the first analog signal OAS1 to the echo path EP.

In step S320, the input digital signal IS is received from the signal source SS and the pseudo-noise digital signal IN is received from the pseudo-noise source NS by the second conversion circuit 110B when being enabled to perform digital-to-analog conversion to generate the second analog signal OAS2 to the echo path EP.

In step S330, signal processing is performed on the echo path EP by the echo transmission circuit 120 to generate an echo signal ES.

In step S340, mapping is performed according to the first codeword offset mapping table TB1 and processing is performed according to the group of first response coefficients CC1 by the first calibration circuit 130 based on a feeding of the input digital signal IS, to generate the first calibration signal ECS1 corresponding to the first conversion circuit 110A.

In step S350, mapping is performed according to the second codeword offset mapping table TB2 and processing is performed according to the group of second response coefficients CC2 by the second calibration circuit 140 based on the feeding of the input digital signal IS and the pseudo-noise digital signal IN, to generate the second calibration signal ECS2 corresponding to the second conversion circuit 110B.

In step S360, the first offset DA1 and the second offset DA2 are generated by the calibration parameter calculating circuit 170 according to the difference between the echo signal ES and the combination of the first calibration signal ECS1 and the second calibration signal ECS2 and path information related to the first calibration circuit 130 and the second calibration circuit 140.

In step S370, the group of first response coefficients CC1 and the group of the second response coefficients CC2 are respectively converged according to the echo signal ES and the first codeword offset mapping table TB1 and the second codeword offset mapping table TB2 are respectively updated according to the first offset DA1 and the second offset DA2 by the first calibration circuit 130 and the second calibration circuit 140.

Figure 4:
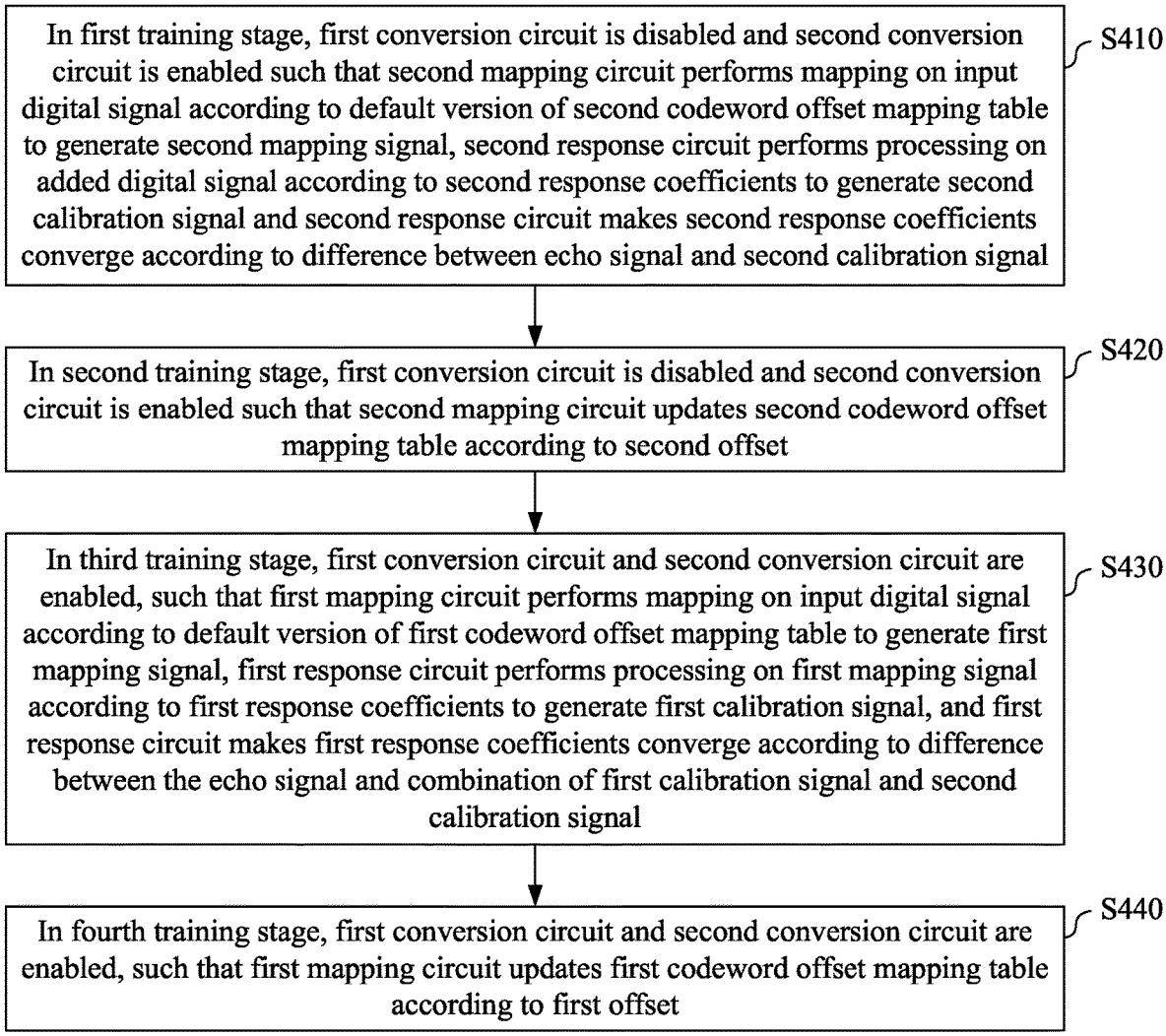
FIG. 4 illustrates a flow chart of a training process used in the DAC apparatus in FIG. 1 according to an embodiment of the present invention.

Reference is now made to FIG. 4. FIG. 4 illustrates a flow chart of a training process 400 used in the DAC apparatus 100 in FIG. 1 according to an embodiment of the present invention.

In step S410, in the first training stage, the first conversion circuit 110A is disabled and the second conversion circuit 110B is enabled such that the second mapping circuit 145A performs mapping on the input digital signal IS according to a default version of the second codeword offset mapping table TB2 to generate the second mapping signal DS2. The second response circuit 145B performs processing on the added digital signal SD according to the second response coefficients CC2 to generate the second calibration signal ECS2. The second response circuit 145B makes the second response coefficients CC2 converge according to the difference between the echo signal ES and the second calibration signal ECS2.

In step S420, in the second training stage, the first conversion circuit 110A is disabled and the second conversion circuit 110B is enabled, such that the second mapping circuit 145A updates the second codeword offset mapping table TB2 according to the second offset DA2.

In step S430, in the third training stage, the first conversion circuit 110A and the second conversion circuit 110B are enabled, such that the first mapping circuit 135A performs mapping on the input digital signal IS according to a default version of the first codeword offset mapping table TB1 to generate the first mapping signal DS1. The first response circuit 135B performs processing on the first mapping signal DS1 according to the first response coefficients CC1 to generate the first calibration signal ECS1. The first response circuit 135B makes the first response coefficients CC1 converge according to the difference between the echo signal ES and the combination of the first calibration signal ECS1 and the second calibration signal ECS2.

In step S440, in the fourth training stage, the first conversion circuit 110A and the second conversion circuit 110B are enabled, such that the first mapping circuit 135A updates the first codeword offset mapping table TB1 according to the first offset DA1.

Figure 5:
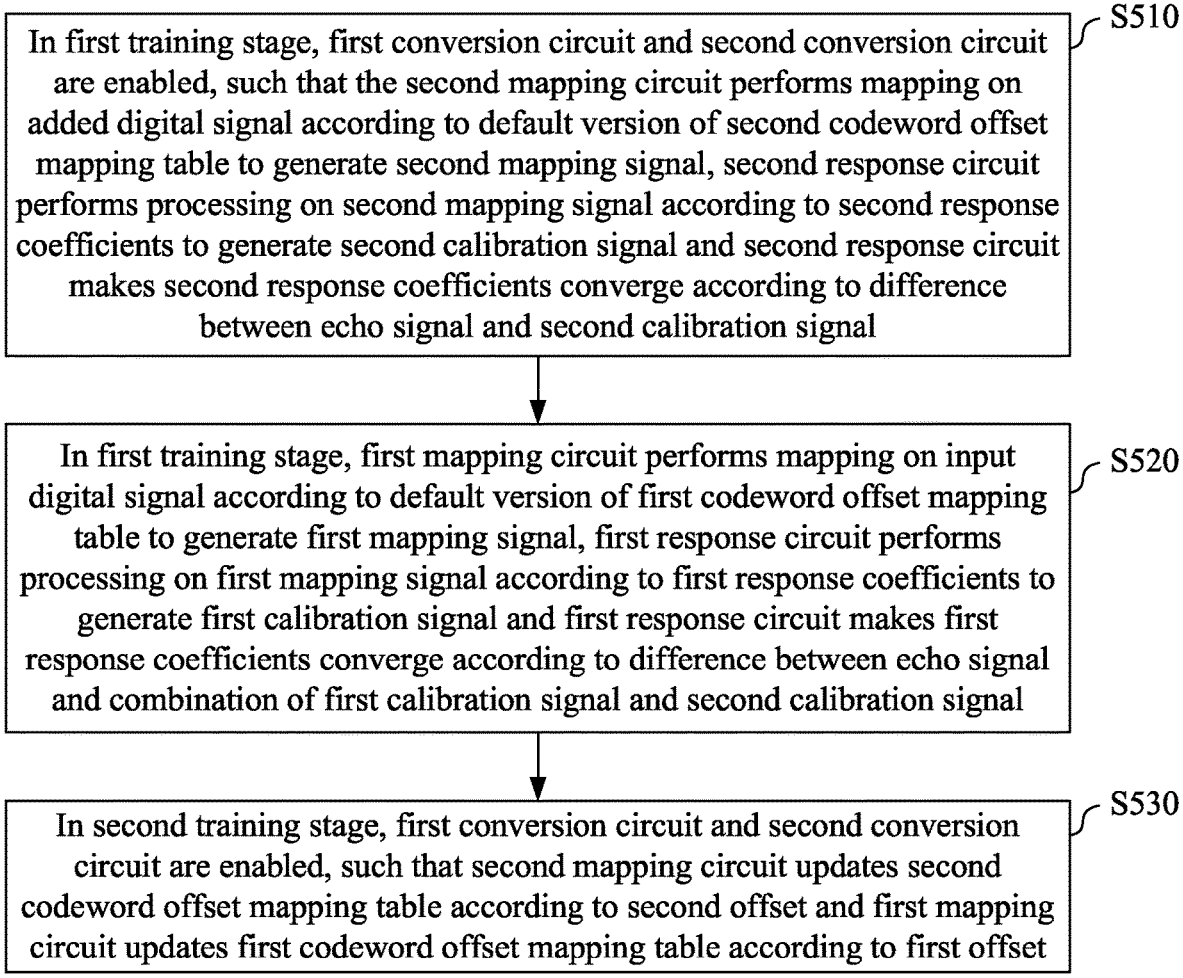
FIG. 5 illustrates a flow chart of a training process used in the DAC apparatus in FIG. 2 according to an embodiment of the present invention.

Reference is now made to FIG. 5. FIG. 5 illustrates a flow chart of a training process 500 used in the DAC apparatus 200 in FIG. 2 according to an embodiment of the present invention.

In step S510, in the first training stage, the first conversion circuit 110A and the second conversion circuit 110B are enabled, such that the second mapping circuit 145A performs mapping on the added digital signal SD according to the default version of the second codeword offset mapping table TB2 to generate the second mapping signal DS2. The second response circuit 145B performs processing on the second mapping signal DS2 according to the second response coefficients CC2 to generate the second calibration signal ECS2. The second response circuit 145B makes the second response coefficients CC2 converge according to the difference between the echo signal ES and the second calibration signal ECS2.

In step S520, in the first training stage, the first mapping circuit 135A performs mapping on the input digital signal IS according to the default version of the first codeword offset mapping table TB1 to generate the first mapping signal DS1. The first response circuit 135B performs processing on the first mapping signal DS1 according to the first response coefficients CC1 to generate the first calibration signal ECS1. The first response circuit 135B makes the first response coefficients CC1 converge according to the difference between the echo signal ES and the combination of the first calibration signal ECS1 and the second calibration signal ECS2.

In step S530, in the second training stage, the first conversion circuit 110A and the second conversion circuit 110B are enabled, such that the second mapping circuit 145A updates the second codeword offset mapping table TB2 according to the second offset DA2 and the first mapping circuit 135A updates the first codeword offset mapping table according to the first offset DA1.

It is appreciated that the embodiments described above are merely an example. In other embodiments, it should be appreciated that many modifications and changes may be made by those of ordinary skill in the art without departing, from the spirit of the disclosure. For example, in the above description, the first conversion circuit is the output conversion circuit and the second conversion circuit is the echo-canceling conversion circuit. In an embodiment, the first conversion circuit can also be the echo-canceling conversion circuit and the second conversion circuit can also be the output conversion circuit.

In summary, the present invention discloses the digital-to-analog conversion apparatus and the digital-to-analog conversion method to perform training on the calibration circuits with different training stages according to the feeding of different signals to avoid the effect on the training due to the interaction among different calibration circuits.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion (DAC) apparatus having signal calibration mechanism, comprising:
  a first conversion circuit to receive an input digital signal having a codeword from a signal source when being enabled to perform digital-to-analog conversion to generate a first analog signal to an echo path;
  a second conversion circuit to receive the input digital signal from the input digital signal and receive a pseudo-noise digital signal from a pseudo-noise source when being enabled to perform digital-to-analog conversion to generate a second analog signal to the echo path;
  an echo transmission circuit to perform signal processing on the echo path to generate an echo signal;
  a first calibration circuit to perform mapping according to a first codeword offset mapping table and perform processing according to a group of first response coefficients based on a feeding of the input digital signal, to generate a first calibration signal corresponding to a first conversion circuit;

a second calibration circuit to perform mapping according to a second codeword offset mapping table and perform processing according to a group of second response coefficients based on a feeding of the input digital signal and the pseudo-noise digital signal, to generate a second calibration signal corresponding to a second conversion circuit; and a calibration parameter calculating circuit to generate a first offset and a second offset according to a difference between the echo signal and a combination of the first calibration signal and the second calibration signal and path information related to the first calibration circuit and the second calibration circuit, wherein the first calibration circuit and the second calibration circuit respectively make the group of first response coefficients and the group of the second response coefficients converge according to the echo signal and respectively update the first codeword offset mapping table and the second codeword offset mapping table according to the first offset and the second offset.

2. The digital-to-analog conversion apparatus of claim 1, wherein the first conversion circuit is an output conversion circuit, the first analog signal is an output analog signal, the second conversion circuit is an echo-canceling conversion circuit, the second analog signal is an echo-canceling analog signal, and the echo-canceling analog signal is used to perform echo-canceling on the input digital signal on the echo path.

3. The digital-to-analog conversion apparatus of claim 1, wherein the first calibration circuit comprises a first mapping circuit configured to perform mapping according to the first codeword offset mapping table to generate a first mapping signal and a first response circuit configured to perform processing according to the group of first response coefficients to generate the first calibration signal; and the second calibration comprises a second mapping circuit configured to perform mapping according to the second codeword offset mapping table to generate a second mapping signal and a second response circuit configured to perform processing according to the group of second response coefficients to generate the second calibration signal.

4. The digital-to-analog conversion apparatus of claim 3, further comprising a pseudo-noise feeding circuit configured to receive the second mapping signal from the second mapping circuit and receive the pseudo-noise digital signal from the pseudo-noise source, to generate an added digital signal such that the second response circuit receives the added digital signal, in which the second conversion circuit further comprises a non-noise conversion circuit and a noise conversion circuit, so that the non-noise conversion circuit receives the input digital signal to perform digital-to-analog conversion thereon and the noise conversion circuit receives the pseudo-noise digital signal to perform digital-to-analog conversion thereon;

wherein in a first training stage, the first conversion circuit is disabled and the second conversion circuit is enabled such that the second mapping circuit performs mapping on the input digital signal according to a default version of the second codeword offset mapping table to generate the second mapping signal, the second response circuit performs processing on the added digital signal according to the group of second response coefficients to generate the second calibration signal and the second response circuit makes the group of second response coefficients converge according to a difference between the echo signal and the second calibration signal;

in a second training stage, the first conversion circuit is disabled and the second conversion circuit is enabled such that the second mapping circuit updates the second codeword offset mapping table according to the second offset;

in a third training stage, the first conversion circuit and the second conversion circuit are enabled such that the first mapping circuit performs mapping on the input digital signal according to a default version of the first codeword offset mapping table to generate the first mapping signal, the first response circuit performs processing on the first mapping signal according to the group of first response coefficients to generate the first calibration signal and the first response circuit makes the group of first response coefficients converges according to the difference between the echo signal and the combination of the first second calibration signal and the second calibration signal; and in a fourth training stage, the first conversion circuit and the second conversion circuit are enabled such that the first mapping circuit updates the first codeword offset mapping table according to the first offset.

5. The digital-to-analog conversion apparatus of claim 3, further comprising a pseudo-noise feeding circuit configured to receive the input digital signal from the signal source and receive the pseudo-noise digital signal from the pseudo-noise source, to generate an added digital signal such that the second conversion circuit receives the added digital signal to perform digital-to-analog conversion thereon, wherein in a first training stage, the first conversion circuit and the second conversion circuit are enabled such that the second mapping circuit performs mapping on the added digital signal according to a default version of the second codeword offset mapping table to generate the second mapping signal, the second response circuit performs processing on the second mapping signal according to the group of second response coefficients to generate the second calibration signal and the second response circuit makes the group of second response coefficients converge according to a difference between the echo signal and the second calibration signal;

in the first training stage, the first mapping circuit performs mapping on the input digital signal according to a default version of the first codeword offset mapping table to generate the first mapping signal, the first response circuit performs processing on the first mapping signal according to the group of first response coefficients to generate the first calibration signal and the first response circuit makes the group of first response coefficients converge according to the difference between the echo signal and the combination of the first second calibration signal and the second calibration signal; and in a second training stage, the first conversion circuit and the second conversion circuit are enabled such that the second mapping circuit updates the second codeword offset mapping table according to the second offset and the first mapping circuit updates the first codeword offset mapping table according to the first offset.

6. A digital-to-analog conversion method having signal calibration mechanism used in a digital-to-analog conversion apparatus, comprising:

receiving an input digital signal having a codeword from a signal source by a first conversion circuit when being enabled to perform digital-to-analog conversion to generate a first analog signal to an echo path;

receiving the input digital signal from the input digital signal and receiving a pseudo-noise digital signal from a pseudo-noise source by a second conversion circuit when being enabled to perform digital-to-analog conversion to generate a second analog signal to the echo path;

performing signal processing on the echo path by an echo transmission circuit to generate an echo signal;

performing mapping according to a first codeword offset mapping table and performing processing according to a group of first response coefficients by a first calibration circuit based on a feeding of the input digital signal, to generate a first calibration signal corresponding to a first conversion circuit;

performing mapping according to a second codeword offset mapping table and performing processing according to a group of second response coefficients by a second calibration circuit based on a feeding of the input digital signal and the pseudo-noise digital signal, to generate a second calibration signal corresponding to a second conversion circuit;

generating a first offset and a second offset by a calibration parameter calculating circuit according to a difference between the echo signal and a combination of the first calibration signal and the second calibration signal and path information related to the first calibration circuit and the second calibration circuit; and respectively making the group of first response coefficients and the group of the second response coefficients converge according to the echo signal and respectively updating the first codeword offset mapping table and the second codeword offset mapping table according to the first offset and the second offset by the first calibration circuit and the second calibration circuit.

7. The digital-to-analog conversion method of claim 6, wherein the first conversion circuit is an output conversion circuit, the first analog signal is an output analog signal, the second conversion circuit is an echo-canceling conversion circuit, the second analog signal is an echo-canceling analog signal, and the echo-canceling analog signal is used to perform echo-canceling on the input digital signal on the echo path.

8. The digital-to-analog conversion method of claim 6, wherein the first calibration circuit comprises a first mapping circuit configured to perform mapping according to the first codeword offset mapping table to generate a first mapping signal and a first response circuit configured to perform processing according to the group of first response coefficients to generate the first calibration signal; and the second calibration comprises a second mapping circuit configured to perform mapping according to the second codeword offset mapping table to generate a second mapping signal and a second response circuit configured to perform processing according to the group of second response coefficients to generate the second calibration signal.

9. The digital-to-analog conversion method of claim 8, wherein the second response circuit directly receives the pseudo-noise digital signal from the pseudo-noise source and the second conversion circuit comprises a non-noise conversion circuit and a noise conversion circuit, so that the non-noise conversion circuit receives the input digital signal to perform digital-to-analog conversion thereon and the noise conversion circuit receives the pseudo-noise digital signal to perform digital-to-analog conversion thereon, the digital-to-analog conversion method further comprises:

further comprising a pseudo-noise feeding circuit configured to receive the second mapping signal from the second mapping circuit and receive the pseudo-noise digital signal from the pseudo-noise source, to generate an added digital signal such that the second response circuit receives the added digital signal, in which the second conversion circuit further comprises a non-noise conversion circuit and a noise conversion circuit, so that the non-noise conversion circuit receives the input digital signal to perform digital-to-analog conversion thereon and the noise conversion circuit receives the pseudo-noise digital signal to perform digital-to-analog conversion thereon, the digital-to-analog conversion method further comprises:

in a first training stage, disabling the first conversion circuit and enabling the second conversion circuit such that the second mapping circuit performs mapping on the input digital signal according to a default version of the second codeword offset mapping table to generate the second mapping signal, the second response circuit performs processing on the second mapping signal and the pseudo-noise digital signal according to the group of second response coefficients to generate the second calibration signal and the second response circuit makes the group of second response coefficients converge according to a difference between the echo signal and the second calibration signal;

in a second training stage, disabling first conversion circuit and enabling the second conversion circuit such that the second mapping circuit updates the second codeword offset mapping table according to the second offset;

in a third training stage, enabling the first conversion circuit and the second conversion circuit such that the first mapping circuit performs mapping on the input digital signal according to a default version of the first codeword offset mapping table to generate the first mapping signal, the first response circuit performs processing on the first mapping signal according to the group of first response coefficients to generate the first calibration signal and the first response circuit makes the group of first response coefficients converges according to the difference between the echo signal and the combination of the first second calibration signal and the second calibration signal; and in a fourth training stage, enabling the first conversion circuit and the second conversion circuit such that the first mapping circuit updates the first codeword offset mapping table according to the first offset.

10. The digital-to-analog conversion method of claim 8, wherein the digital-to-analog conversion apparatus further comprises a pseudo-noise feeding circuit configured to receive the input digital signal from the signal source and receive the pseudo-noise digital signal from the pseudo-noise source, to generate an added digital signal such that the second conversion circuit receives the added digital signal to perform digital-to-analog conversion thereon, the digital-to-analog conversion method further comprises:

in a first training stage, enabling the first conversion circuit and the second conversion circuit such that the second mapping circuit performs mapping on the added digital signal according to a default version of the second codeword offset mapping table to generate the second mapping signal, the second response circuit performs processing on the second mapping signal according to the group of second response coefficients to generate the second calibration signal and the second response circuit makes the group of second response coefficients converge according to a difference between the echo signal and the second calibration signal;

in the first training stage, performing mapping on the input digital signal according to a default version of the first codeword offset mapping table by the first mapping circuit to generate the first mapping signal, performing processing on the first mapping signal according to the group of first response coefficients by the first response circuit to generate the first calibration signal and making the group of first response coefficients converge by the first response circuit according to the difference between the echo signal and the combination of the first second calibration signal and the second calibration signal; and in a second training stage, enabling the first conversion circuit and the second conversion circuit such that the second mapping circuit updates the second codeword offset mapping table according to the second offset and the first mapping circuit updates the first codeword offset mapping table according to the first offset.

\* \* \* \* \*